(12) United States Patent
Lu et al.

(10) Patent No.: US 11,837,564 B2
(45) Date of Patent: Dec. 5, 2023

(54) SEMICONDUCTOR BONDING STRUCTURE

(71) Applicant: Powerchip Semiconductor Manufacturing Corporation, Hsinchu (TW)

(72) Inventors: Chun-Lin Lu, Hsinchu (TW); Shou-Zen Chang, Hsinchu (TW); Ying-Tsung Chu, Hsinchu (TW); Chi-Ming Chen, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 262 days.

(21) Appl. No.: 17/398,017

(22) Filed: Aug. 10, 2021

(65) Prior Publication Data

US 2023/0018214 A1    Jan. 19, 2023

(30) Foreign Application Priority Data

Jul. 19, 2021   (TW) .................................. 110126462

(51) Int. Cl.
*H01L 23/00* (2006.01)
*H01L 25/18* (2023.01)
*H01L 25/065* (2023.01)

(52) U.S. Cl.
CPC ............. *H01L 24/08* (2013.01); *H01L 24/05* (2013.01); *H01L 25/0657* (2013.01); *H01L 25/18* (2013.01); *H01L 2224/05087* (2013.01); *H01L 2224/05091* (2013.01); *H01L 2224/05098* (2013.01); *H01L 2224/05147* (2013.01); *H01L 2224/08145* (2013.01); *H01L 2924/01013* (2013.01); *H01L 2924/01029* (2013.01); *H01L 2924/01074* (2013.01); *H01L 2924/04941* (2013.01); *H01L 2924/1431* (2013.01); *H01L 2924/1436* (2013.01)

(58) Field of Classification Search
CPC ..... H01L 24/08; H01L 24/05; H01L 25/0657; H01L 25/18; H01L 2924/1431; H01L 2924/1436
See application file for complete search history.

(56) References Cited

U.S. PATENT DOCUMENTS 11,043,472 B1 * 6/2021 Dokania ............. H01L 23/5389
2015/0294955 A1 * 10/2015 Chen ....................... H01L 24/03
257/777

(Continued)

FOREIGN PATENT DOCUMENTS

KR    101763022      7/2017
TW    202114111 A   4/2021

*Primary Examiner* — Mamadou L Diallo
(74) *Attorney, Agent, or Firm* — Winston Hsu

(57) ABSTRACT

The invention provides a semiconductor bonding structure, the semiconductor bonding structure includes a first chip and a second chip which are bonded with each other, the first chip has a first bonding pad and the second bonding pad contacted and electrically connected to each other on a bonding interface, the first bonding pad and the second bonding pad are made of copper, and a heterogeneous contact combination in the first chip, the heterogeneous contact combination comprises a contact stack structure of a copper element, a tungsten element and an aluminum element, the tungsten element is located between the copper element and the aluminum element.

11 Claims, 3 Drawing Sheets

(56) References Cited

U.S. PATENT DOCUMENTS

| | | | |
|---|---|---|---|
| 2016/0013160 A1* | 1/2016 | Chun | H01L 25/50 257/751 |
| 2022/0246562 A1* | 8/2022 | Hou | H01L 25/18 |
| 2022/0328419 A1* | 10/2022 | Lin | H01L 21/6835 |
| 2022/0336394 A1* | 10/2022 | Ishikawa | H01L 24/06 |
| 2022/0359456 A1* | 11/2022 | Chen | H01L 25/0657 |
| 2022/0359482 A1* | 11/2022 | Farooq | H01L 25/18 |
| 2022/0399295 A1* | 12/2022 | Lai | H01L 24/08 |

* cited by examiner

SEMICONDUCTOR BONDING STRUCTURE

BACKGROUND OF THE INVENTION

1. Field of the Invention

The present invention relates to the field of semiconductor manufacturing process, in particular to a chip bonding structure with copper-tungsten-aluminum heterogeneous contact combination, which has the advantages of reducing resistance and improving production.

2. Description of the Prior Art

In the semiconductor manufacturing process, in order to save the use area of the chip, multi-layered stacked electronic element structures are often formed in the vertical direction in a stacked manner, which can effectively reduce the total area and facilitate the miniaturization of the chip.

In addition, the required electronic elements can be formed on different chips, and then the different chips can be bonded together to achieve the same stacking effect. Therefore, the bonding quality between chips will affect the yield of the final semiconductor device.

At present, in the conventional semiconductor manufacturing process, in order to improve the bonding quality between chips, the bonding pad which are in contact with each other and electrically connected with each other are usually made of copper (Cu) with good conductivity. However, the cost of copper is relatively high. In order to reduce the cost, in some chips, such as dynamic random access (DRAM) chips, cheaper aluminum (Al) may be used to make the horizontal metal trace and vertical via structure of the wiring. In this way, the heterogeneous interface between copper and aluminum will be generated in the DRAM chip, and the interface resistance generated by this interface is relatively high, and the manufacturing process of the interface between copper and aluminum is relatively immature, so it is easy to cause manufacturing problems.

SUMMARY OF THE INVENTION

The invention provides a semiconductor bonding structure, which comprises a first chip and a second chip which are bonded with each other, wherein the first chip has a first bonding pad and the second bonding pad are in contact and electrically connected on a bonding interface, wherein the first bonding pad and the second bonding pad are made of copper, and a heterogeneous contact combination in the first chip, wherein the heterogeneous contact combination comprises a contact stack structure consist of a copper element, a tungsten element and an aluminum element, wherein the tungsten element is located between the copper element and the aluminum element.

To solve the problems in the prior art, the present invention provides a chip bonding structure including a copper-tungsten-aluminum heterogeneous interface, which can replace the copper-aluminum interface. In the prior art, the resistance of the interface (copper-aluminum interface) between the copper element and the aluminum element is relatively high, and the manufacturing process is relatively immature, so that it is not conducive to electrical conduction and is prone to manufacturing problems. In the present invention, a tungsten element is added between the copper element and the aluminum element, and the original copper-aluminum interface is divided into two parts: a copper-tungsten interface and a tungsten-aluminum interface. In terms of electrical characteristics, adding tungsten element between copper element and aluminum element is beneficial to improve conductivity, and in terms of manufacturing process, the processes of making copper-tungsten interface and making tungsten-aluminum interface are relatively mature processes, so it has the advantages of improving the yield of semiconductor elements and being compatible with existing processes.

These and other objectives of the present invention will no doubt become obvious to those of ordinary skill in the art after reading the following detailed description of the preferred embodiment that is illustrated in the various figures and drawings.

DETAILED DESCRIPTION

In order to enable those who are familiar with the technical field of the present invention to further understand the present invention, the preferred embodiments of the present invention are listed below, and the composition and the desired effects of the present invention are described in detail in conjunction with the attached drawings.

For convenience of explanation, the drawings of the present invention are only schematic to make it easier to understand the present invention, and the detailed scale can be adjusted according to the design requirements. As for the up-down relationship of relative elements in the figure described in this paper, people in the field should understand that it refers to the relative position of objects, so they can all be turned over to present the same elements, which should belong to the scope disclosed in this specification, and be described here first.

Figure 1:
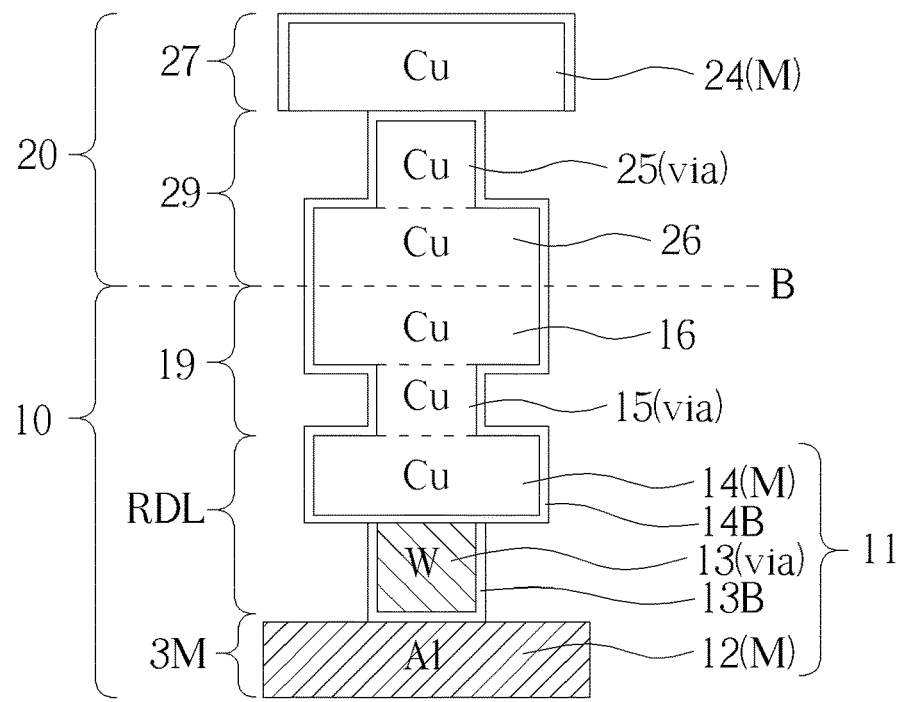
FIG. 1 is a partial schematic cross-sectional view of a semiconductor bonding structure according to a first preferred embodiment of the present invention.

FIG. 1 is a partial schematic cross-sectional view of a semiconductor bonding structure according to the first preferred embodiment of the present invention. As shown in FIG. 1, two chips are provided in this embodiment, namely a first chip 10 and a second chip 20 bonded to each other. In this embodiment, the first chip 10 is a dynamic random access (DRAM) chip, and the second chip 20 is a logic integrated circuit (logic IC) chip. In the general semiconductor field, the logic integrated circuit chip is used to process digital signals (0 or 1), perform arithmetic and judgment functions, and has high requirements for execution speed. Therefore, in order to improve the performance of the logic integrated circuit chip, copper (Cu) with good conductivity is usually used to make the wiring inside the logic integrated circuit chip (including metal trace (hereinafter referred to as M) and via structure). On the other hand, the DRAM chip is mainly used for storing data, and the requirement for execution speed is not as high as that of the above-mentioned logic integrated circuit chip, so the wiring inside the DRAM chip may be made of aluminum (Al) with lower cost, so as to achieve the effect of reducing cost.

In order to improve the bonding quality between the first chip 10 and the second chip 20, copper with good conductivity is usually used to make bonding pads exposed on the surfaces of the first chip 10 and the second chip 20, and the bonding pads on the surfaces of the first chip 10 and the second chip 20 are made of the same material, which can also reduce the difficulty of bonding steps. However, as mentioned above, since the metal traces made of aluminum already exists in the first chip 10 (DRAM chip), the interface between copper elements (contact pads and via) and aluminum elements (traces such as horizontal metal traces) will be generated inside the first chip 10. According to the current manufacturing process, the interface processing technology between copper elements and aluminum elements is relatively immature, and the interface resistance is relatively poor. However, due to the above reasons, the bonding pads and traces need to be made of copper and aluminum, respectively, in order to improve the bonding quality and reduce the cost, so it is not easy to replace copper and aluminum with other materials.

Returning to FIG. 1, the present invention adds a tungsten element between the copper element and the aluminum element to solve the above problems. As shown in FIG. 1, a first chip 10 and a second chip 20 are bonded to each other in a face-to-face manner. On a bonding interface B between the first chip 10 and the second chip 20, a first bonding pad 16 and a second bonding pad 26 are in contact with each other and electrically connected to connect the two chips. It is worth noting that the inside of the first chip 10 and the inside of the second chip 20 contain a plurality of electronic elements (transistors, etc.), horizontal metal traces (M) and via structures. In order to simplify the drawing, only the horizontal metal traces (M) and the via structure in a part of the first chip 10 and the second chip 20 are shown in FIG. 1, and the lower/upper electronic elements are omitted. In addition, in FIG. 1, elements belonging to the horizontal metal traces are indicated by (M), while elements belonging to the vertical via structure are indicated by (via).

The first chip 10 includes an aluminum element 12, a tungsten element 13, a copper element 14, a copper via structure 15 and a first bonding pad 16. In this embodiment, the aluminum element 12 is located in the third metal dielectric layer (3M), the tungsten element 13 and the copper element 14 are located in the redistribution layer RDL, and the copper via structure 15 and the first bonding pad 16 are located in the bonding layer 19. The above-mentioned horizontal metal traces (M) or via structure (via) is located in the dielectric layer (the third metal dielectric layer 3M, the redistribution layer RDL and the bonding layer 19), and the dielectric layer is an insulating material, such as silicon oxide, silicon nitride, etc., for isolating the horizontal metal traces (M) or via structure from other electronic elements. Other traces, vertical via structures, electronic elements, etc. are connected below the aluminum element 12, which are not drawn for the sake of simplicity of the drawing.

In this embodiment, the aluminum element 12 is a horizontal metal traces located in the topmost metal dielectric layer. In this embodiment, the topmost layer is the third metal dielectric layer as an example, but not limited to this. Generally speaking, in order to save the cost of DRAM chips, most of the horizontal metal traces M and via structures in DRAM are made of aluminum. That is to say, not only the traces in the third metal dielectric layer (3M) are aluminum traces, but also the horizontal metal traces M and via structure in the second metal dielectric layer (2M) and the first metal dielectric layer (1M) below them are preferably made of aluminum. It should be noted that if more or less metal dielectric layers are formed in the chip, the number of layers distributed by the aluminum elements 12 will change accordingly.

The second chip 20 includes a second bonding pad 26, a copper via structure 25 and a copper element 24. Taking this embodiment as an example, the second bonding pad 26 and the copper via structure 25 are located in the bonding layer 29, and the copper element 24 is located in the metal dielectric layer 27, the above-mentioned horizontal metal traces (M) or vertical via structure (via) are located in the dielectric layer (the metal dielectric layer 27 and the bonding layer 29). The dielectric layer is an insulating dielectric material such as silicon oxide, silicon nitride, etc. In addition, other traces, vertical via structures, electronic elements, etc. should also be included above the copper element 24, which are not drawn for the sake of brevity.

It is worth noting that the first chip 10 includes a heterogeneous contact combination 11 composed of three different material elements, namely, an aluminum element 12, a tungsten element 13 and a copper element 14, wherein the tungsten element 13 is located between the aluminum element 12 and the copper element 14. In this embodiment, the tungsten element 13 and the copper element 14 are elements in a redistribution layer (RDL) additionally formed on the top metal layer. The tungsten element 13 is, for example, a via structure, while the copper element 14 is, for example, a horizontal metal trace. That is, in the first chip 10, the redistribution layer RDL is formed on the aluminum element 12 on the topmost layer (e.g., the third metal dielectric layer 3M), and the tungsten element 13 and the copper element 14 are added, so that the interface resistance between copper-tungsten-aluminum can be reduced, and because the copper-tungsten interface process and the tungsten-aluminum interface process are mature processes, the yield of the semiconductor bonding structure can be improved.

It is worth noting that there is also a first bonding pad 16 above the copper element 14 in the first chip 10. As mentioned above, the first bonding pad 16 is also made of copper, but the copper element 14 and the first bonding pad 16 are located in different layers, so they belong to different structures and do not directly contact with each other.

On the other hand, in this embodiment, the second chip 20 does not contain aluminum elements, so the second chip 20 does not contain heterogeneous contact combinations. However, in other embodiments of the present invention, the second chip 20 may also contain aluminum elements, so it is necessary to form heterogeneous contact combinations to reduce the interface resistance, and this embodiment also falls within the scope of the present invention.

In addition, a barrier layer 14B and a barrier layer 13B may be included and surrounded the copper element 14 and the tungsten element 13, respectively. In which the material of the barrier layer 14B may be tantalum (Ta), tantalum nitride (TaN), titanium (Ti) and titanium nitride (TiN), and the material of the barrier layer 13B may be titanium nitride (TiN), but is not limited thereto.

The feature of this embodiment is that since a high interface resistance may be generated between the first bonding pad 16 and the aluminum element 12, so a redistribution layer RDL is additionally formed between the first bonding pad 16 and the aluminum element 12, and a tungsten element 13 and a copper element 14 for buffering are formed in the redistribution layer RDL to reduce the interface resistance of copper-tungsten-aluminum and improve the electrical performance of the semiconductor bonding structure. In addition, the invention has the advantages of improving product yield and being compatible with the existing process because of the mature process.

In other embodiments of the present invention, the above-mentioned heterogeneous contact combination 11 (that is, the contact combination of Cu—W—Al) can be formed in other places, which can also achieve the effect of reducing the interface resistance. Hereinafter, different embodiments of the semiconductor bonding structure of the present invention will be described, and in order to simplify the description, the following description mainly focuses on the differences of each embodiment, and the similarities will not be repeated. In addition, the same elements in each embodiment of the present invention are labeled with the same reference numerals, which is convenient for comparison among the embodiments.

Figure 2:
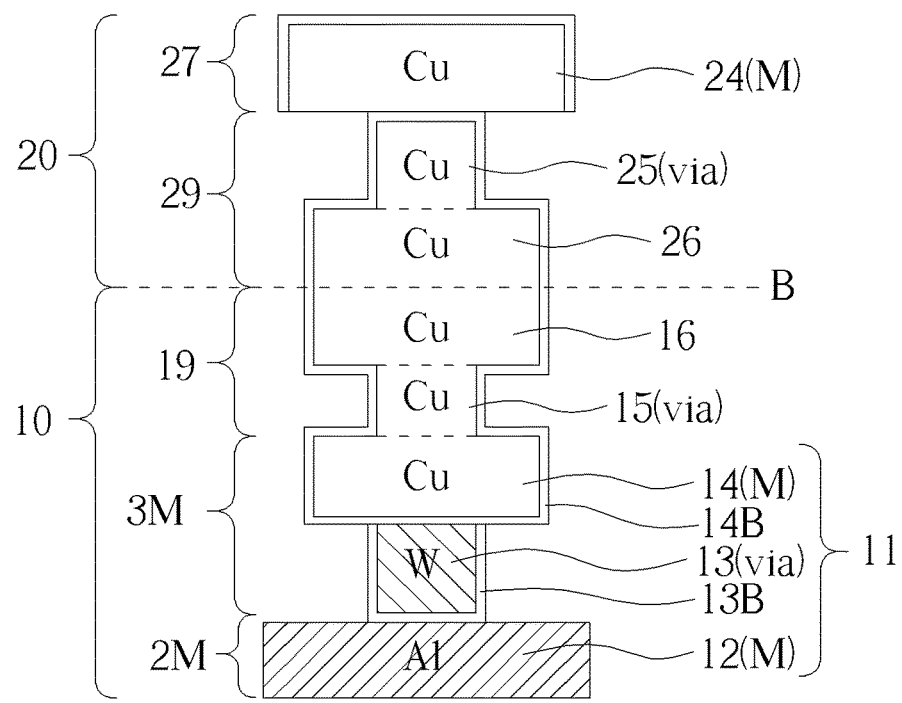
FIG. 2 is a partial schematic cross-sectional view of a semiconductor bonding structure according to a second preferred embodiment of the present invention.

FIG. 2 is a partial schematic cross-sectional view of a semiconductor bonding structure according to a second preferred embodiment of the present invention. As shown in FIG. 2, this embodiment is basically the same as the first embodiment described above, in that the first chip 10 and the second chip 20 are bonded to each other, and the first bonding pad 16 and the second bonding pad 26, which are made of copper, are in contact with each other to achieve electrical connection, and the first chip 10 and the second chip 20 also contain a plurality of electronic elements (not shown), horizontal metal traces (M) and via structures. The main difference from the above embodiment is that in the first chip 10 in this embodiment, the heterogeneous contact combination 11 (that is, the contact combination of copper-tungsten-aluminum) is directly fabricated on the topmost metal dielectric layer (e.g., the third metal dielectric layer 3M) and the sub-topmost metal dielectric layer (e.g., the second metal dielectric layer 2M) except the bonding layer 19. That is to say, when making the metal traces in the sub-top layer in the first chip 10, the aluminum element 12 is made of aluminum, and then the tungsten element 13 and the copper element 14 are made in the third metal dielectric layer (3M), and then the copper via structure 15 and the first bonding pad 16 are made. That is to say, in this embodiment, the redistribution layer RDL is not formed, but the heterogeneous contact combination 11 is directly formed in the topmost metal dielectric layer and the sub-top metal dielectric layer, so as to achieve the same advantages as the above embodiment, including reducing resistance, improving yield and being compatible with currently processes, etc. Other features are the same as those in the above embodiments, so they will not be repeated here.

Figure 3:
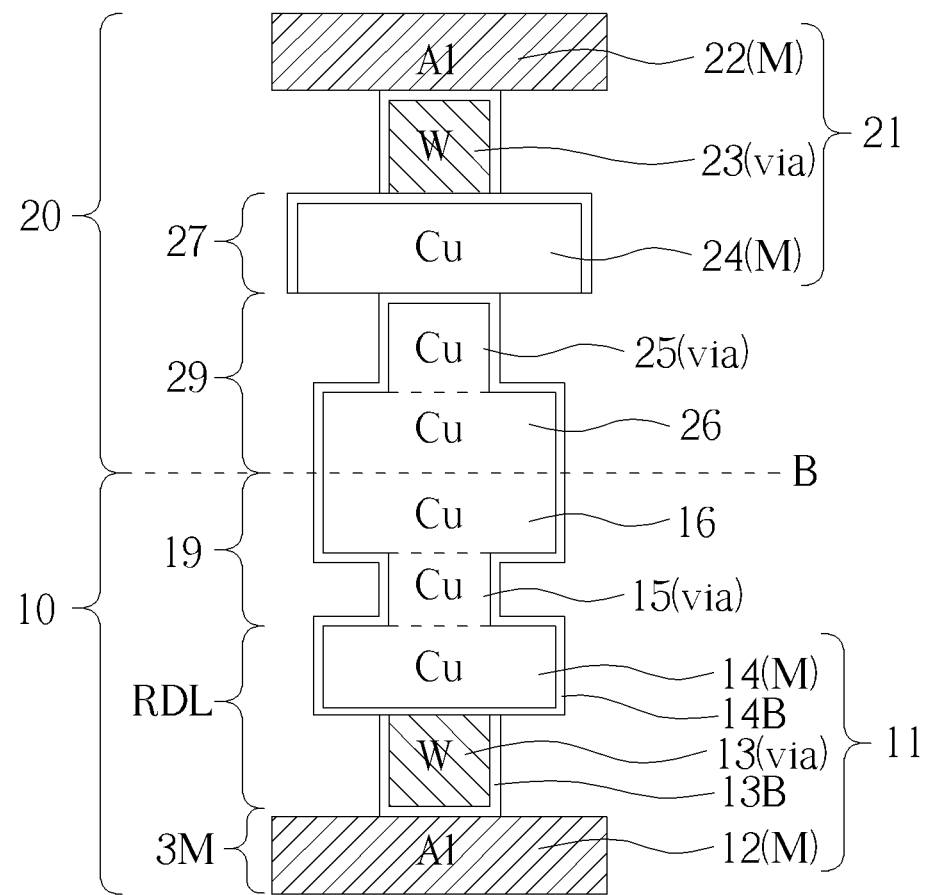
FIG. 3 is a partial schematic cross-sectional view of a semiconductor bonding structure according to a third preferred embodiment of the present invention.

FIG. 3 is a partial schematic cross-sectional view of a semiconductor bonding structure according to a third preferred embodiment of the present invention. As shown in FIG. 3, in this embodiment, except for the heterogeneous contact combination 11 formed in the first chip 10, there may also be a second heterogeneous contact combination 21 in the second chip 20 (that is, the contact combination of copper element 24, tungsten element 23 and aluminum element 22). This embodiment is applicable when aluminum wiring exists in the second chip 20 (for example, the second chip 20 is also a DRAM chip). In addition, the second heterogeneous contact combination 21 may be formed in a redistribution layer (RDL) within the second chip 20 (similar to the first embodiment), or in a metal dielectric layer closest to/and next to the bonding layer 29 (similar to the second embodiment). Other features are the same as those in the above embodiments, so they will not be repeated here.

Figure 4:
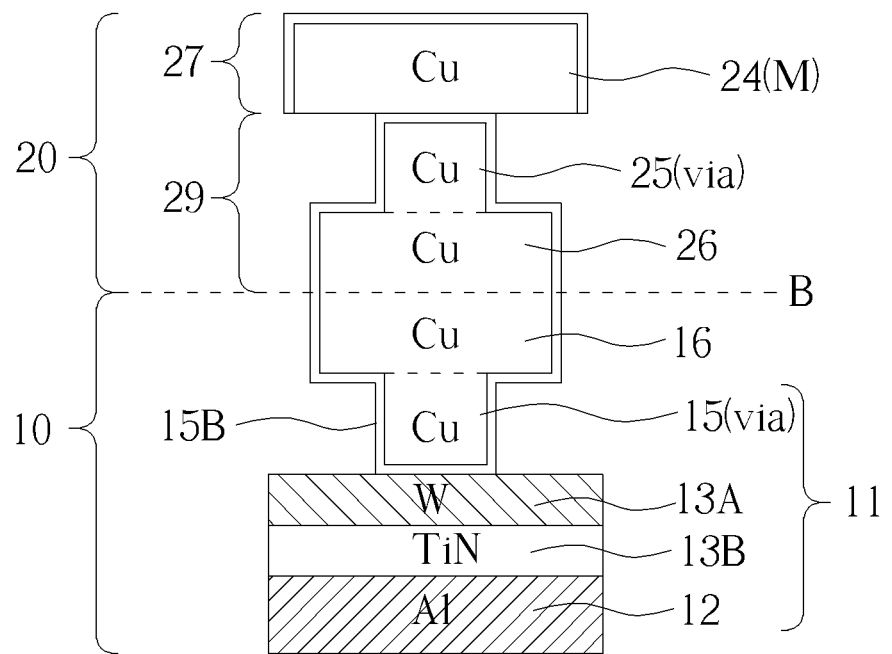
FIG. 4 is a partial schematic cross-sectional view of a semiconductor bonding structure according to a fourth preferred embodiment of the present invention.

FIG. 4 is a partial schematic cross-sectional view of a semiconductor bonding structure according to a fourth preferred embodiment of the present invention. As shown in FIG. 4, this embodiment is basically the same as the first embodiment described above, and the first chip 10 and the second chip 20 are bonded to each other. However, in this embodiment, the tungsten element 13A is directly formed on the aluminum element 12 (the aluminum horizontal metal traces) and has the same pattern size as the aluminum element 12. In addition, a barrier layer (e.g., a titanium nitride layer) 12B is included between the tungsten element 13A and the aluminum element 12, which can be used as a liner layer and can increase the adhesion between the tungsten element 13A and the aluminum element 12. In this embodiment, the copper via structure 15 replaces the original copper element, that is, the heterogeneous contact combination 11 is composed of the aluminum element 12, the titanium nitride layer 12A, the tungsten element 13A and the copper via structure 15. In addition, the periphery of the copper via structure 15 may also include a barrier layer 15B made of tantalum (Ta), tantalum nitride (TaN), titanium (Ti), titanium nitride (TiN), etc., but not limited thereto. This embodiment can achieve the effect of saving steps. Other features are the same as those in the above embodiments, so they will not be repeated here.

According to the above description and drawings, the present invention provides a semiconductor bonding structure comprising a first chip 10 and a second chip 20 bonded to each other, wherein the first chip 10 has a first bonding pad 16 and the second chip 20 has a second bonding pad 26, and the first bonding pad 16 and the second bonding pad 26 are in contact with each other and electrically connected at a bonding interface B, wherein the first bonding pad 16 and the second bonding pad 26 are made of copper, and a heterogeneous contact combination 11 in the first chip 10, wherein the heterogeneous contact combination 11 comprises a contact stack structure composed of a copper element 12, a metal element (tungsten element) 13 and an aluminum element 14, wherein the metal element 13 is located between the copper element 12 and the aluminum element 14.

In some embodiments, the metal element (tungsten element) 13 is a vertical via structure (via).

In some embodiments, the copper element 14 and the aluminum element 12 are a copper horizontal metal traces M and an aluminum horizontal metal traces M, respectively.

In some embodiments, the heterogeneous contact combination 11 is located in the first chip 10 and electrically connected with the first bonding pad 16.

In some embodiments, the copper element 14 of the heterogeneous contact combination 11 is different from the first bonding pad 16.

In some embodiments, the first chip 10 comprises a dynamic random access memory (DRAM) chip and the second chip 20 comprises a logic integrated circuit (logic IC) chip.

In some embodiments, the second chip 20 does not contain heterogeneous contact combinations.

In some embodiments, the second chip contains a plurality of vertical via structures (via) and a plurality of horizontal metal traces M, and the materials of the vertical via structures and the horizontal metal traces in the second chip 20 are copper.

In some embodiments, a second heterogeneous contact combination 21 is included in the second chip, and the second heterogeneous contact combination 21 includes a contact stack structure of a copper element 24, a tungsten element 23 and an aluminum element 22, wherein the tungsten element 23 is located between the copper element 24 and the aluminum element 22.

In some embodiments, the copper element 24 of the second heterogeneous contact combination 21 is different from the second bonding pad 26.

In some embodiments, a titanium nitride (TiN) layer 12A is further included between the tungsten element 13A and the aluminum element 12.

To sum up, the present invention provides a chip bonding structure including a copper-tungsten-aluminum heterogeneous interface, which can replace the conventional copper-aluminum interface. In the prior art, the resistance of the interface (copper-aluminum interface) between the copper element and the aluminum element is relatively high, and the manufacturing process is relatively immature, so that it is not conducive to electrical conduction and is prone to manufacturing problems. In the present invention, a tungsten element is added between the copper element and the aluminum element, and the original copper-aluminum interface is divided into two parts: a copper-tungsten interface and a tungsten-aluminum interface. In terms of electrical characteristics, adding tungsten element between copper element and aluminum element is beneficial to improve conductivity, and in terms of manufacturing process, the processes of making copper-tungsten interface and making tungsten-aluminum interface are relatively mature processes, so it has the advantages of improving the yield of semiconductor elements and being compatible with existing processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor bonding structure, comprising:
a first chip and a second chip bonded to each other, wherein the first chip has a first bonding pad and the second chip has a second bonding pad, and the first bonding pad and the second bonding pad are in contact and electrically connected on a bonding interface, wherein the first bonding pad and the second bonding pad are made of copper; and
a heterogeneous contact combination in the first chip, wherein the heterogeneous contact combination comprises a contact stack structure, wherein the contact stack structure consist of a copper element, a metal element and an aluminum element, wherein the metal element is located between the copper element and the aluminum element, and the material of the metal element does not contain copper or aluminum, wherein the copper element of the heterogeneous contact combination is different from the first bonding pad.

2. The semiconductor bonding structure according to claim 1, wherein the metal element is a via structure.

3. The semiconductor bonding structure according to claim 1, wherein the copper element and the aluminum element are a copper metal trace and an aluminum metal trace respectively.

4. The semiconductor bonding structure according to claim 1, wherein the heterogeneous contact combination is located in the first chip and electrically connected with the first bonding pad.

5. The semiconductor bonding structure according to claim 1, wherein the first chip comprises a dynamic random access memory (DRAM) chip and the second chip comprises a logic integrated circuit (logic IC) chip.

6. The semiconductor bonding structure according to claim 1, wherein the second chip does not contain the heterogeneous contact combination.

7. The semiconductor bonding structure according to claim 6, wherein the second chip contains a plurality of via structures and a plurality of horizontal metal traces, and the materials of the via structures and the horizontal metal traces in the second chip are copper.

8. The semiconductor bonding structure according to claim 1, wherein the second chip contains a second heterogeneous contact combination, and the second heterogeneous contact combination includes a contact stack structure, wherein the contact stack structure consist of a copper element, a second metal element and an aluminum element, wherein the second metal element is located between the copper element and the aluminum element.

9. The semiconductor bonding structure according to claim 8, wherein the copper element of the second heterogeneous contact combination is different from the second bonding pad.

10. The semiconductor bonding structure according to claim 1, further comprising a titanium nitride (TiN) layer located between the metal element and the aluminum element.

11. The semiconductor bonding structure according to claim 1, wherein the material of the metal element comprises tungsten.

* * * * *